United States Patent [19]

Peressini et al.

[11] 4,063,964
[45] Dec. 20, 1977

[54] METHOD FOR FORMING A SELF-ALIGNED SCHOTTKY BARRIER DEVICE GUARDRING

[75] Inventors: Peter Paul Peressini, Wappingers Falls; Timothy Martin Reith, Poughkeepsie; Michael James Sullivan, Red Hook, all of N.Y.

[73] Assignee: International Business Machines Corporation, Armonk, N.Y.

[21] Appl. No.: 754,218

[22] Filed: Dec. 27, 1976

[51] Int. Cl.² ............................................ H01L 21/265
[52] U.S. Cl. ......................................... 148/1.5; 357/15; 427/84
[58] Field of Search ........................... 148/1.5; 357/15; 427/84

[56] References Cited
U.S. PATENT DOCUMENTS 3,669,730  6/1972  Lepselter ............................. 117/200

OTHER PUBLICATIONS

W. D. Buckley et al., "Structure . . . . Pd₂Si contacts on . . . Si and diffused P–N diodes" Solid Sta. Electronics, 15, (1972), 1331.

R. J. Baughman et al., "Prep., . . . Growth . . . of PtSi and PtGe", Mat. Res. Bull. 7, (1972), 1035.

*Primary Examiner*—L. Dewayne Rutledge
*Assistant Examiner*—Upendra Roy
*Attorney, Agent, or Firm*—George O. Saile

[57] ABSTRACT

The method allows the formation of a self-aligned guardring surrounding a Schottky barrier device. The resulting guardring is as close to the Schottky barrier device as is possible. This reduces the area of the chip used by other guardring forming techniques of the prior art. The method involves first opening a hole in an insulator to expose the silicon surface. The Schottky barrier forming metal is then deposited over the insulator and the silicon surface. Heat treatment of the appropriate temperature and time is utilized to form the metal silicide Schottky barrier device. During this device formation, there is a volume shrinkage in the metal silicide which forms a narrow annulus of exposed silicon around the metal silicide contact. The unreacted metal is removed. Ion implantation of ion of opposite polarity to the exposed silicon is imparted to the structure to form a guardring surrounding the Schottky barrier device.

16 Claims, 6 Drawing Figures

METHOD FOR FORMING A SELF-ALIGNED SCHOTTKY BARRIER DEVICE GUARDRING

BACKGROUND OF THE INVENTION

The present invention relates to Schottky barrier devices and more particularly to methods for forming Schottky barrier devices with guardrings surrounding the devices which take up the minimum amount of silicon surface area.

DESCRIPTION OF THE PRIOR ART

When a metal is brought into intimate contact with a lightly-doped semiconductor, the resulting metalsemiconductor interface exhibits current rectifying characteristics. The junction is commonly referred to as a Schottky barrier device. This device acts in a similar fashion to a P-N junction and possesses a number of qualities which are desirable for monolithic integrated circuit applications. When the device is operated in forward bias, current flows due to majority carrier injection from the semiconductor into the metal and minority carrier current is negligible. Because of this, Schottky barrier devices are virtually free from long recovery times and charge-storage capacitance. Schottky barrier devices have a steeper forward current-voltage slope (I-V) and a lower turn-on voltage than P-N junctions. They also have generally lower series resistance and reverse breakdowns.

These Schottky barrier devices are well known and have been extensively treated in books, articles and patents. The use of a guardring surrounding the Schottky barrier devices has been known as reported, for example, in "Physics of Semiconductor Devices" by S. M. Sze, published by John Wiley & Sons, Inc., New York, 1969 at pages 401, 402, and U.S. Pat. No. 3,924,320, C. Altman et al "Method to Improve the Reverse Leakage Characteristics in Metal Semiconductor Contacts," so as to produce devices which have sharper, more reproducible reverse breakdown characteristics. This structure would also be advantageous for forward voltage control of devices such as described in "Microstructural and Electrical Properties of Thin PtSi Films and the Relationship to Deposition Parameters" by R. M. Anderson and T. M. Reith, Journal of Electrochemical Society, Vol. 122, No. 10, October 1975, pages 1337-1347. The problem with the use of guardrings in the monolithic circuit technologies has been in the implementation. The use of guardrings have not been feasible because of the extra surface area required for the guarding structures. The trade-off of the surface area for improved device characteristics has not been significant enough up to now to utilize the substantially increased surface area required for guardrings of present technology.

Various metals have been known to form metal silicide Schottky barrier contacts. The above mentioned Anderson and Reith article describes the platinum silicide Schottky barrier device. U.S. Pat. No. 3,506,893 to V. A. Dhaka entitled "Integrated Circuits With Surface Barrier Diodes" also describes platinum silicide. The U.S. Pat. No. 3,451,912 to F. M. D'Heurle et al "Schottky-Barrier Diode Formed by Sputter-Deposition Processes" describes the use of Tungsten silicide, chromium silicide and molybdenum silicide. The U.S. Pat. No. 3,900,344 to I. E. Magdo, "Novel Integratable Schottky Barrier and Method for the Fabrication Thereof" describes an aluminum-platinum contact.

The beforementioned C. Altman et al Patent shows a metal silicide Schottky barrier device overlapping the guardring. This structure has the disadvantage of requiring significantly more surface area than a conventional non-guardring device or the guardring device described herein due to overlap tolerances and other dimensional limitations of a large scale integration process.

SUMMARY OF THE INVENTION

In accordance with the present invention, there is provided a method for producing a guardring surrounding the periphery of a Schottky barrier device which uses a minimum of semiconductor surface area. This is accomplished by utilizing the physical characteristic resulting from the formation of metal silicide Schottky barrier devices of a volume shrinkage in the insulator opening. The volume shrinkage of the metal silicide produces a narrow annulus of exposed silicon around the metal silicide contact. The metal silicide in conjunction with the insulator which may be in the form of a thermally grown silicon dioxide, a recessed oxide insulator, silicon nitride or similar material defines the Schottky barrier diode perimeter. This combination can be used as a mask for a shallow ion implantation of the opposite polarity to the silicon layer on which the Schottky barrier device is made. The result of this method is a metal silicide Schottky barrier with a self-aligned guardring immediately surrounding the metal silicide Schottky barrier device.

BRIEF DESCRIPTION OF THE PREFERRED EMBODIMENTS

Figure 1:
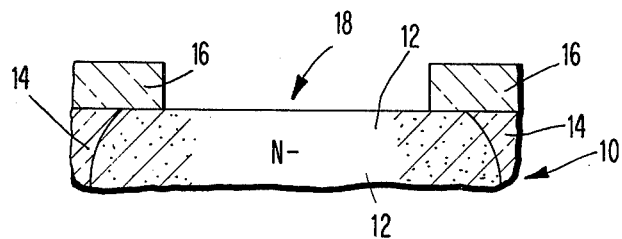
FIGS. 1-6 are schematic illustrations of the steps for manufacturing one form of the present invention.
Figure 2:
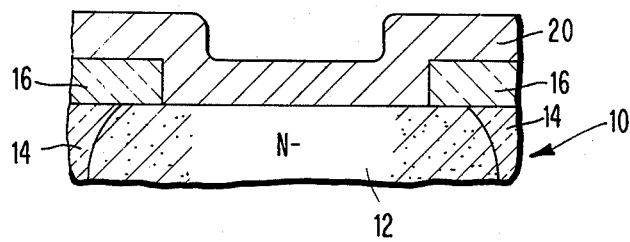

Referring to FIG. 1, a wafer of N- type conductivity preferably having a resistivity in the order of 1.0 ohm-cm and a thickness of about 8 to 16 mils is used as the starting substrate 10. The substrate is preferably a monocrystalline structure which can be fabricated by conventional techniques such as Czochralski crystal growing from a melt containing the desired impurity concentration. Wafers are formed by slicing the crystal into a plurality of thin wafers by a suitable cutting tool. The wafer surfaces are then polished as is conventional in the art. The substrate 10 alternatively may be a silicon wafer having an epitaxial silicon layer grown on the surface. In this situation the wafer can be a P-type wafer with an N-epitaxial layer. If such an epitaxial layer is used, it preferably has a thickness within the 2 to 6 micron range.

Although the present invention concerns Schottky barrier devices, it is understood that the Schottky barrier devices would be formed on the semiconductor wafers together with a multiplicity of other types and numbers of semiconductor devices such as bipolar transistors, resistors, MOSFET devices and so forth. For simplicity purposes, these other devices are not shown in the drawings. Schottky barrier devices are used advantageously in combinations with other devices such as bipolar transistors to form circuits of various circuit technologies such as diode transistor logic (DTL).

The Schottky barrier diode may be formed in a region 12 in the N- silicon substrate which is isolated from other regions of the substrate 10 by means of conventional junction isolation or recessed oxide isolation. The FIG. 1 shows the isolated region 12 which is isolated from other such regions by the recessed silicon dioxide region 14. Techniques for forming the recessed isolation regions are known and described in the I. Magdo et al patent application Ser. No. 150,609, and assigned to the assignee of the present patent application, and in the Peltzer U.S. Pat. No. 3,648,125. For simplicity purposes, the details of the formation of the recessed oxide region 14 will not be given in this description.

A thermal silicon dioxide insulating region 16 is grown across the surface of the silicon body 14. Alternate insulating layers may of course be utilized and alternate methods for forming the silicon dioxide are available. For example, aluminum oxide, silicon nitride and combinations of the several insulating materials may be used as the insulator 16. The insulator may be formed on the silicon surface by chemical vapor deposition, cathodic sputtering or thermal techniques. Using conventional photoresist and selective etching techniques, opening 18 is made to expose the surface of the N- 12.

Figure 3:
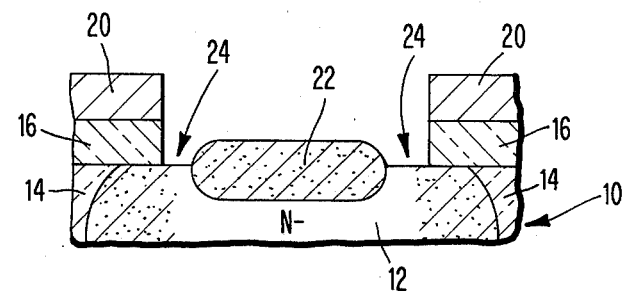
Figure 4:
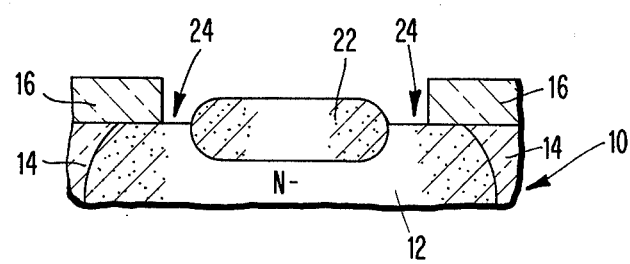

A thin layer of the metal which will form a metal silicide Schottky barrier contact is then deposited over the surface to form a metal layer 20. The metal 20 may be deposited by any conventional technique such as evaporation or sputtering. The resulting structure is then sintered in an inert atmosphere at a suitable temperature and time depending upon the particular metal silicide which is to form the Schottky barrier device contact. The sintering operation produces an alloying of the metal in the opening 18 with the exposed silicon while the remainder of the metal 20 remains unaffected. FIG. 3 shows this result wherein the metal silicide 22 is now part of the Schottky barrier device and the remaining metal 20 is unreacted. Also shown in FIG. 3 is the result of the formation of the metal silicide sintering which is the volume shrinkage that forms a narrow annulus 24 of exposed silicon completely surrounding the metal silicide Schottky barrier contact and within the insulator 16. The remaining or unalloyed metal is then removed by suitable means such as selective etching which will remove the metal without affecting the Schottky barrier metal silicide contact to form the structure of FIG. 4.

The structure is now put into the ion implantation chamber wherein it is bombarded with ions 26 to form, in the present embodiment, a P+ annular region 28 surrounding the metal silicide Schottky barrier device 22. The region 28 is the guardring which provides the advantage of tighter voltage control and sharper, more reproducible reverse breakdown characteristics without using an undue amount of silicon surface area. Where, as in this embodiment, an N- silicon surface is utilized, typically boron ion bombardment is utilized to form the P+ regions 28. The preferred process parameter for forming a suitable guardring with boron is a dosage of about $10^{14}$ boron ions per cm$^2$. An energy of about 50-100 KeV is usable. Alternatively, where the substrate is a P type, a N+ region 28 would be formed as the guardring using suitable N type ions such as arsenic and phosphorus.

Figure 5:
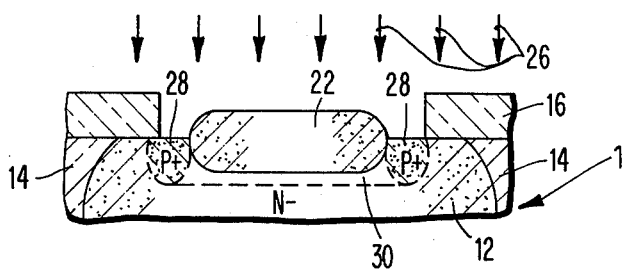

A further alternative is to utilize an increased ion implantation energy of the order of between about 100 to 200 keV so that the ions will penetrate through the metal silicide so as to produce a very shallow implanted region 30 under the metal silicide 22. Shallow implantations of the opposite polarity to the region directly under the Schottky barrier contact are useful to tailor the device's forward characteristics without adversely affecting the reverse bias behavior. This device concept is known and described in "Control of Schottky Barrier Height Using Highly Doped Surface Layers" by J. M. Shannon in Solid-State Electronics, 1976, Volume 19, pages 537-543. In the Shannon article, the shallow implantation is formed prior to the formation of the metal silicide contact. The present method, wherein the regions formed after the formation of the metal silicide, has the advantage over the Shannon method in that in addition to the self-aligned guardring feature, control of shallow implantation layers can be achieved with relatively high accelerating voltages. The resulting structure is shown in FIG. 5. To prevent interaction between the silicide and the aluminum, a diffusion barrier 31 is then deposited by conventional evaporation or sputtering techniques. Any of several refractory metals such as titanium, tungsten, or chromium are suitable as the barrier layer 31.

Figure 6:
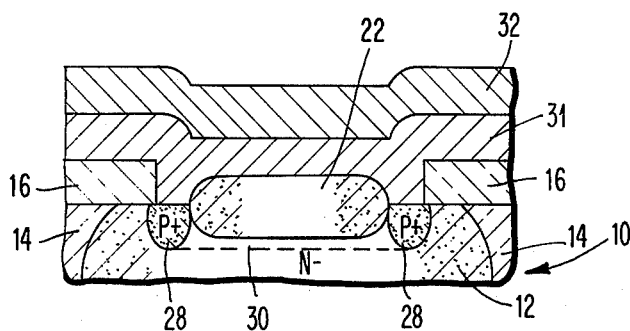

Next, a layer of aluminum or other suitable metal is evaporated over the entire surface of the structure. The evaporated layer of aluminum has a thickness of several thousand Angstrom units. A layer of photoresist is then applied over the metal surface, dried, exposed, developed and fixed. The aluminum interconnections 32 between the Schottky barrier device of the FIG. 6 with other devices such as bipolar transistors, MOSFETs, diodes and resistors are made by conventional subtractive etching procedures. The photoresist is then removed. The resulting structure of the process is shown in FIG. 6.

Various metals and metal alloys can be utilized to form the metal silicides of the present invention. Platinum is a preferred metal in this context. The sintering of the platinum is typically at a temperature of between 500° and 600° C for 30 minutes. Other suitable metals which form Schottky barrier devices are usable so long as they exhibit sufficient shrinkage during sintering to form the metal silicide with an annulus of bare silicon surrounding it. A necessary and sufficient condition for shrinkage is that the molecular volume of the metal plus that of the silicon be greater than the molecular volume of the silicide. The greater the difference the more the shrinkage. The shrinkage in volume, of course, is a requisite in the present process. Some of the metals which operate in a similar fashion to platinum in the volume shrinkage feature are cobalt, iron manganese and palladium.

While the invention has been particularly described with reference to the preferred embodiments thereof, it will be understood by those skilled in the art that the foregoing and other changes in form and details may be made therein without departing from the spirit and scope of the invention.

What is claimed is:

1. Method for forming a self-aligned guard ring surrounding a Schottky barrier device comprising:
   opening a region in an insulator to expose a silicon surface;
   depositing a Schottky barrier forming metal through said opening;
   heat treating the structure to form the metal silicide contact for said Schottky barrier device wherein there is a volume shrinkage forming a narrow annulus of exposed silicon around said metal silicide contact;
   removing any said metal that has not been reacted to said metal silicide; and ion implanting an ion of opposite polarity to the exposed silicon to form a guardring surrounding the Schottky barrier device.

2. The method of claim 1 wherein said silicon substrate is N type and said ion is P type.

3. The method of claim 1 wherein said silicon substrate is P type and said ion is N type.

4. The method of claim 2 wherein the dosage of said ion is greater than about $10^{14}$ per cm$^2$ at between about 50 and 100 keV.

5. The method of claim 4 wherein the said ion is boron.

6. The method of claim 1 wherein the said heat treatment is in the order of 500° to 600° C for more than about 30 minutes.

7. The method of claim 6 wherein the resistivity of the surface of said substrate is within the range of about 0.1 to 10.0 ohm-cm.

8. The method of claim 7 wherein the substrate is N type and said ion is P type, and the surface concentration of said guardring is between about $10^{18}$ to $10^{19}$ atoms/cm$^3$.

9. The method of claim 1 wherein a diffusion barrier layer is formed over said guardring in said silicon surface.

10. The method of claim 9 wherein said metal silicide contact is composed of platinum silicide and said diffusion barrier layer is composed of chromium.

11. The method of claim 10 wherein aluminum metal is formed over the surface of said contact.

12. The method of claim 1 wherein the deposited contact metal has a thickness between about 400 and 600 A.

13. The method of claim 12 wherein the deposited metal is platinum.

14. The method of claim 12 wherein aqua regia is used to remove any said metal which has not reacted to said metal silicide.

15. The method of claim 1 wherein the energy applied in said implantation is sufficient for the ions to penetrate said metal silicide and to form a shallow implanted region under said metal silicide.

16. The method of claim 15 wherein said metal silicide is platinum silicide and said ion is boron.

* * * * *